United States Patent
Wu

(10) Patent No.: US 6,608,391 B1
(45) Date of Patent: Aug. 19, 2003

(54) PREPARATION METHOD OF UNDERFILL FOR FLIP CHIP PACKAGE AND THE DEVICE

(75) Inventor: Tung-Shen Wu, Kaohsiung (TW)

(73) Assignee: Orient Semiconductor Electronics Limited, Kaohsiung (TW)

( * ) Notice: Subject to any disclaimer, the term of this patent is extended or adjusted under 35 U.S.C. 154(b) by 33 days.

(21) Appl. No.: 10/161,745

(22) Filed: Jun. 5, 2002

(30) Foreign Application Priority Data

Apr. 24, 2002 (TW) ........................................ 90131983 A

(51) Int. Cl.$^7$ .............................................. H01L 23/28
(52) U.S. Cl. ..................... 257/787; 257/780; 257/738; 257/737; 438/127; 438/126; 438/110
(58) Field of Search .......................... 438/127, 29, 126, 438/110, 114, 128, 106; 257/738, 737, 778, 787, 789, 780

(56) References Cited

U.S. PATENT DOCUMENTS 6,329,224 B1 * 12/2001 Nguyen et al. ............. 438/127

* cited by examiner

Primary Examiner—David L. Talbott
Assistant Examiner—Luan Thai
(74) Attorney, Agent, or Firm—Leong C. Lei

(57) ABSTRACT

A preparation method of underfill for flip chip packaging and the device for such method are disclosed. A carrier having a slot at the center thereof is used to hold a substrate having mounted with a plurality of flip chips. The top surface of an upper heat-resistant tape and the bottom surface of a lower heat-resistant tape having the same size are formed into a elongated sealed cavity, and one end of the cavity is injected with fill and the other end is used to extract air so that the underfill is rapidly filled up the cavity between the chips and the substrate, the height of the fillers around the chip can be controlled and will not form bubbles. Thus, the yield and capacity of production are high.

2 Claims, 3 Drawing Sheets

PREPARATION METHOD OF UNDERFILL FOR FLIP CHIP PACKAGE AND THE DEVICE

BACKGROUND OF THE INVENTION (a) Technical Field of the Invention

The present invention relates to flip chip package technology, and in particular, a method of preparing underfill into cavity between substrate and the soldered flip chip.

(b) Description of the Prior Art

Generally, in conventional flip chip technology, after the flip chip has been mounted with the substrate, filling glue process is employed at the edge of the flip chip (1 to 2 edges) so that the liquid glue is absorbed by capillary phenomenon and the air at the other edge without fill is extracted so as to allow fill all the gap between the chip and the substrate. After that a thermal hardening process is performed.

The conventional method of glue filling is not easily employed on chip with larger surface area or with high density of protruded blocks. In the process of glue filling, void is between the chip and the substrate can be formed easily. After the filling process, the height of the filler surrounded the chip cannot be controlled easily. If the height of the filler does not reach half the height of the chips thickness, cracks on the glue body will be formed, in particular at the corner of the chip is the most serious. In addition, the conventional method can only treat the fill of a single chip and therefore the yield is low. And, the moving force as a result of capillary is limited and the capillary principle cannot be easily employed on chip of large surface area. If the density of the protruded block of chip is high the void is too small and filling is not easily. If the protruded blocks are not symmetrically distributed, the speed of the filler will be affected and the condition of filling cannot be easily controlled.

SUMMARY OF THE INVENTION

Accordingly, it is an object of the present invention to provide a method of preparing underfill for flip chip package, wherein a carrier covers a substrate and chip and the top surface of an upper heat-resistant tape and the bottom surface of a lower heat-resistant tape having the same size are formed into a elongated sealed cavity, and one end of the cavity is injected with fill and the other end is used to extract air so that the underfill is rapidly filled up the cavity between the chips and the substrate, the height of the fillers around the chip can be controlled and will not form bubble. Thus, the yield and capacity of production are high.

An aspect of the present invention is to provide a device for preparing underfill of flip chip package having a carrier, an upper heat-resistant tape, a lower heat-resistant tape to cover a substrate bonded with chips to form a covered cavity, and one end of the covered cavity being filled with an underfill and another end of the cavity being undergone extraction of air within the covered cavity, characterized in that the carrier is a hard board for fabrication which is wider than the substrate and has a slot at the center, the wide and the length of the slot are smaller than that of the substrate but wider than that of the chip on the substrate, the centers of the narrower sides of the slot are respectively provided with externally extended loop and air-extraction path and the carrier is provided with positioning holes; and the upper heat-resistant tape is a high heat resistant tape with adhesion and is adhered onto the top surface of the carrier, the slot, the loop and the air-extracting path are covered and the end terminal of the loop is provided with a filling hole, and an air-extracting hole is provided at the end terminal of the air-extracting path; and the lower heat-resistant tape is a high heat-resistant tape with adhesion and can be covered at the bottom surface of the carrier.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1A:
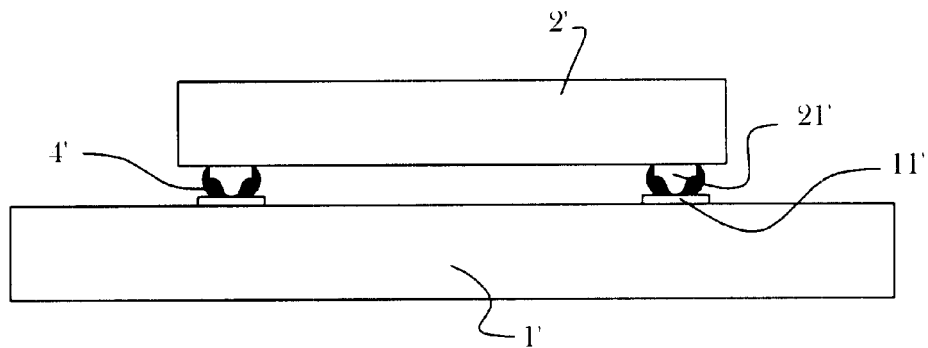
FIGS. 1a–1c are schematic views showing conventional method of fill dispensing of underfill applicable in flip-chip package.
Figure 1B:
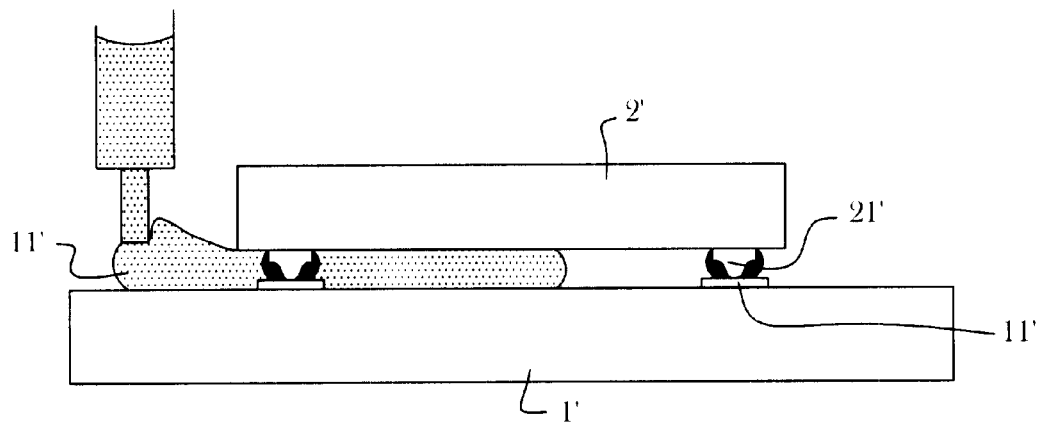
Figure 1C:
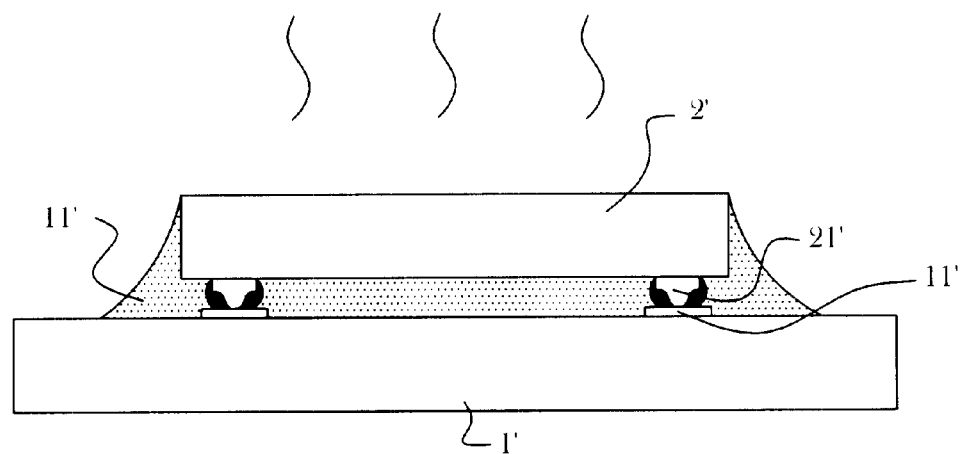
Figure 2:
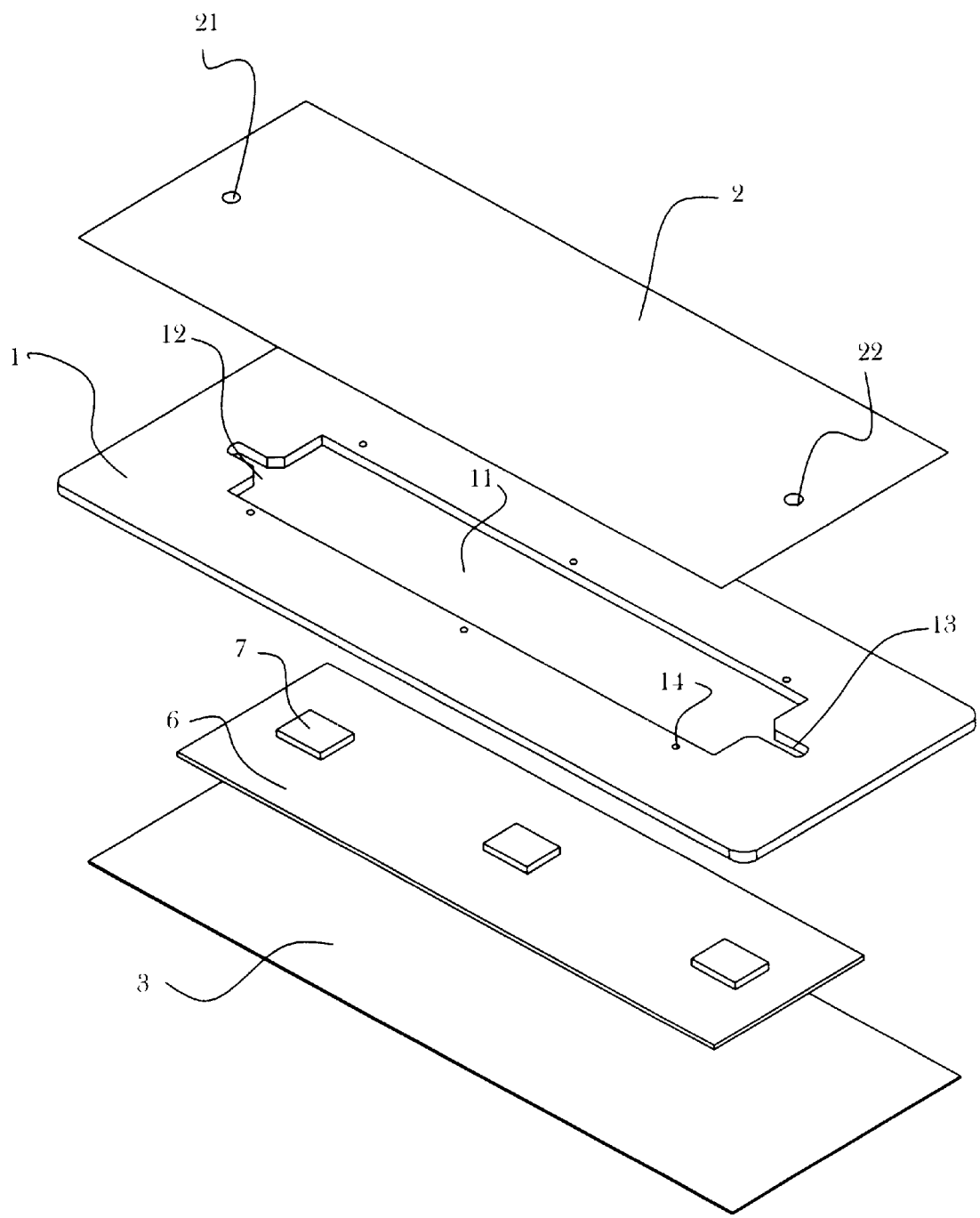
FIG. 2 is a schematic view showing the structure of the present invention.

Referring to FIG. 2, the present invention employs a carrier 1, an upper heat-resistant tape 2, a lower heat-resistant tape 3 to cover a substrate 6 bonded with chips 7 to form a covered cavity 4, and one end of the covered cavity 4 is filled with an underfill 5 and another end of the cavity 4 is undergone extraction of air within the covered cavity 4, characterized in that the carrier 1 is a hard board for fabrication which is wider than the substrate 6 and has a slot 11 at the center, the wide and the length of the slot 11 are smaller than that of the substrate 6 but wider than that of the chip 7 on the substrate 6.

The centers of the narrower sides of the slot 11 are respectively provided with externally extended loop 12 and air-extraction path 13 and the carrier 1 is provided with positioning holes 14. The upper heat-resistant tape 2 is a high heat resistant tape with adhesion and is adhered onto the top surface of the carrier 1. The slot 11, after it has been cut into appropriate wide and length, the loop 12 and the air-extraction path 13 are covered, and the end terminal of the loop 12 is provided with a filling hole 21, and an air-extraction hole 22 is provided at the end terminal of the air-extraction path 13. The lower heat-resistant tape 3 is a high heat-resistant tape with adhesion and can be covered at the bottom surface of the carrier 1.

Figure 3A:
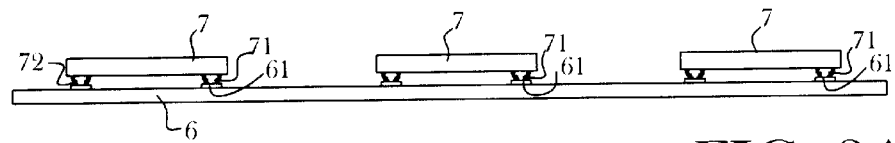
FIGS. 3a–3e show the manufacturing steps in accordance with the present invention.
Figure 3B:
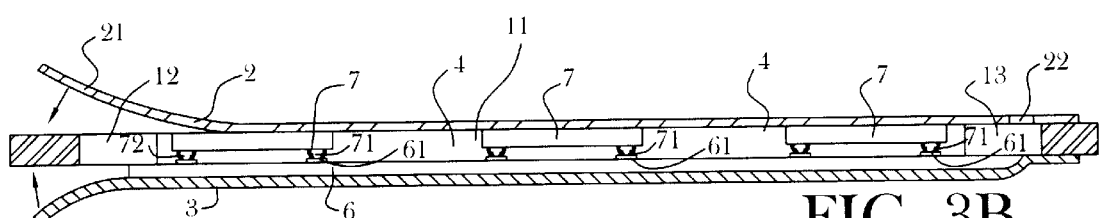
Figure 3C:
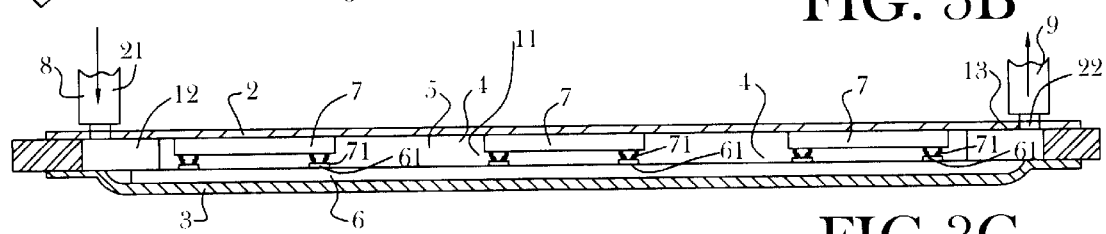
Figure 3D:
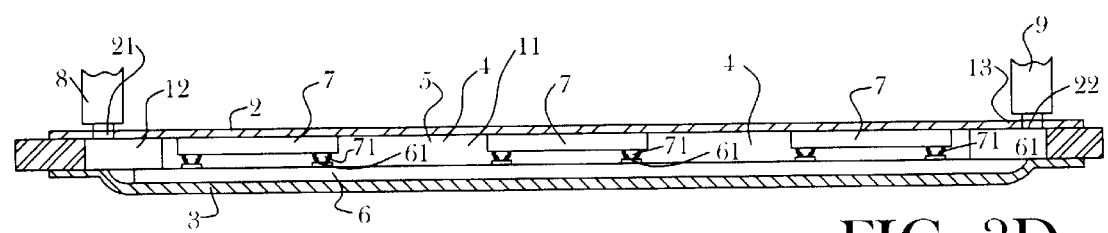
Figure 3E:
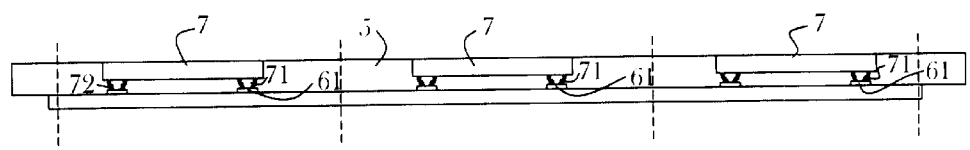

In accordance with the present invention, the preparation method of underfill for flip chip package comprises the steps of (a) heat-treating of the protruded block 71 on chip 7 with solder 72 and soldering a plurality of chips 7 onto a substrate 6, (as shown in FIG. 3*a*);

(b) placing the soldered chip 7 and the substrate 6 beneath the slot 11 of the carrier 1 such that the top edge of the substrate 6 urges the bottom edge of the slot 11 and the chip 7 of the substrate 6 is located within the slot 11, after that adhering the upper heat-resistant tape 2 onto the top surface of the carrier 1 to fully cover the slot 11 and the bottom edge of the upper heat-resistant tape 2 is adhered at the top edge of the chip 7, and the filling hole 21 is exactly positioned at the left top of the loop 12, and the air-extraction hole 22 is positioned at the right top of the air-extraction path 13, and at the same time the lower heat-resistant tape 3 is adhered onto the bottom surface of the substrate 6 and the bottom surface of the carrier 1. The substrate 6 is fully covered underneath the carrier 1 so that the surroundings formed by the slot 11, the bottom surface formed by the top surface of the substrate 6, and the top surface formed by the bottom surface of the upper heat-resistant tape 2 are formed into a covered cavity 4 (as shown in FIG. 3(B));

(c) underfilling the covered cavity 4 by a fill syringe 8 via the syringe hole 21 on the upper heat-resistant tape 2 and an extractor 9 is aligned with the air-extraction hole 22 on the upper heat-resistant tape 2, and simultaneously air within the covered cavity 4 is extracted with an appropriate speed (as shown in FIGS. 3C, 3D);

peeling off the upper 2 and lower heat-resistant tape 3 after a terminal-hardening step is performed to complete packaging of the underfill and then cutting the carrier 1 based on positioning holes 14 thereon to form an appropriate single module (as shown in FIG. 3E).

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

What is claimed is:

1. A device for preparing underfill of flip chip package having a carrier, an upper heat-resistant tape, a lower heat-resistant tape to cover a substrate bonded with chips to form a covered cavity, and one end of the covered cavity being filled with an underfill and another end of the cavity being undergone extraction of air within the covered cavity, characterized in that the carrier is a hard board for fabrication which is wider than the substrate and has a slot at the center, the wide and the length of the slot are smaller than that of the substrate but wider than that of the chip on the substrate, the centers of the narrower sides of the slot are respectively provided with externally extended loop and air-extraction path and the carrier is provided with positioning holes; and the upper heat-resistant tape is a high heat resistant tape with adhesion and is adhered onto the top surface of the carrier, the slot, the loop and the air-extracting path are covered and the end terminal of the loop is provided with a filling hole, and an air-extracting hole is provided at the end terminal of the air-extracting path; and the lower heat-resistant tape is a high heat-resistant tape with adhesion and can be covered at the bottom surface of the carrier.

2. A preparation method of underfill for flip chip package comprising the steps of:

a. heat-treating of the protruded block on chip with solder and welding the chip onto a substrate;

b. placing the soldered chip and substrate beneath the slot of the carrier such that the top edge of the substrate urges the bottom edge of the slop and the chip of the substrate is located within the slot, after that adhering the upper heat-resistant tape onto the top surface of the carrier to fully cover the slot and the bottom edge of the upper heat-resistant tape is adhered at the top edge of the chip, and the filling hole is exactly positioned at the left top of the loop, and the air-extracting hole is positioned at the right top of the air-extraction path, and at the same time the lower heat-resistant tape is adhered onto the bottom surface of the substrate and the bottom surface of the carrier, the substrate is fully covered underneath the carrier so that the surroundings formed by the slot, the bottom surface formed by the top surface of the substrate and the top surface formed by the bottom surface of the upper heat-resistant tape are formed with a covered cavity;

c. underfilling the covered cavity by a fill syringe via the syringe hole on the upper heat-resistant tape and the extractor being aligned with the air-extraction hole on the upper heat-resistant tape, and simultaneously, air within the covered cavity being extracted; and d. peeling off the upper and lower heat-resistant tape after a terminal-hardening step to complete packaging of the underfill and then cutting the carrier based on the positioning holes thereon to form an appropriate single module.

* * * * *